United States Patent
Fluegel et al.

(10) Patent No.: US 11,242,606 B2
(45) Date of Patent: Feb. 8, 2022

(54) COMPOSITION FOR TIN OR TIN ALLOY ELECTROPLATING COMPRISING SUPPRESSING AGENT

(71) Applicant: BASF SE, Ludwigshafen am Rhein (DE)

(72) Inventors: Alexander Fluegel, Ludwigshafen (DE); Marco Arnold, Ludwigshafen (DE); Nadine Engelhardt, Ludwigshafen (DE); Marcel Patrik Kienle, Limburgerhof (DE)

(73) Assignee: BASF SE, Ludwigshafen am Rhein (DE)

( * ) Notice: Subject to any disclaimer, the term of this patent is extended or adjusted under 35 U.S.C. 154(b) by 0 days.

(21) Appl. No.: 17/048,770

(22) PCT Filed: Apr. 11, 2019

(86) PCT No.: PCT/EP2019/059344
§ 371 (c)(1),
(2) Date: Oct. 19, 2020

(87) PCT Pub. No.: WO2019/201753
PCT Pub. Date: Oct. 24, 2019

(65) Prior Publication Data
US 2021/0180201 A1    Jun. 17, 2021

(30) Foreign Application Priority Data
Apr. 20, 2018  (EP) ..................... 18168462

(51) Int. Cl.
*C25D 3/32*  (2006.01)
(52) U.S. Cl.
CPC ..................... *C25D 3/32* (2013.01)
(58) Field of Classification Search
None
See application file for complete search history.

(56) References Cited

U.S. PATENT DOCUMENTS

| 4,135,991 A | 1/1979 | Canaris et al. |
| 4,871,429 A | 10/1989 | Nobel et al. |

(Continued)

FOREIGN PATENT DOCUMENTS

| EP | 0 854 206 A1 | 7/1998 |
| EP | 2 141 261 A2 | 1/2010 |

(Continued)

OTHER PUBLICATIONS

International Search Report dated Jul. 3, 2019 in PCT/EP2019/059344 filed on Apr. 11, 2019, 4 pages.

*Primary Examiner* — Wojciech Haske
(74) *Attorney, Agent, or Firm* — Armstrong Teasdale LLP

(57) ABSTRACT

The present invention provides an aqueous composition comprising tin ions and at least one compound of formula I wherein $X_1$ is selected from a linear or branched $C_1$-$C_{12}$ alkanediyl, which may optionally be interrupted by O or S or a $C_5$ to $C_{12}$ aromatic moiety, $R^{11}$ is a copolymer of ethylene oxide and a further $C_3$ to $C_6$ alkylene oxide, wherein the content of ethylene oxide is from 5 to 30% by weight, $R^{12}$ is selected from H, $R^{11}$, $R^{40}$, $R^{13}$, $R^{14}$, are (a) independently selected from H, $R^{11}$, $R^{40}$, or (b) may together form a divalent group $X^{13}$; $X^{13}$ is selected from a linear or branched $C_1$-$C_{12}$ alkanediyl, which may optionally be interrupted by O, S or $NR^{43}$; $R^{40}$ is H or a linear or branched $C_1$-$C_{20}$ alkyl, $R^{43}$ is selected from H, $R^{11}$ and a linear or branched $C_1$-$C_{20}$ alkyl.

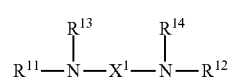

(I)

14 Claims, 4 Drawing Sheets

(56) References Cited

U.S. PATENT DOCUMENTS

| | | |
|---|---|---|
| 5,174,887 A | 12/1992 | Federman et al. |
| 7,628,903 B1 | 12/2009 | Tsuji et al. |
| 7,781,325 B2 | 8/2010 | Lee et al. |
| 8,980,077 B2 | 3/2015 | Romer et al. |
| 2006/0094226 A1 | 5/2006 | Huang et al. |
| 2008/0054459 A1 | 3/2008 | Lee et al. |
| 2008/0296761 A1 | 12/2008 | Lee et al. |
| 2012/0027948 A1 | 2/2012 | Roeger-Goepfert et al. |
| 2013/0264213 A1* | 10/2013 | Roeger-Goepfert ..... C25D 3/38 205/118 |
| 2015/0122661 A1 | 5/2015 | Woertink et al. |
| 2015/0122662 A1 | 5/2015 | Woertink et al. |

FOREIGN PATENT DOCUMENTS

| | | |
|---|---|---|
| GB | 1 567 235 | 5/1980 |
| JP | 4296358 B2 | 7/2009 |
| WO | WO 2010/069810 A1 | 6/2010 |
| WO | WO 2010/115757 A1 | 10/2010 |
| WO | WO 2016/020216 A1 | 2/2016 |
| WO | WO 2017/121657 A1 | 7/2017 |
| WO | WO 2018/114985 A1 | 6/2018 |
| WO | WO 2018/219848 A1 | 12/2018 |

\* cited by examiner

COMPOSITION FOR TIN OR TIN ALLOY ELECTROPLATING COMPRISING SUPPRESSING AGENT

BACKGROUND OF THE INVENTION

The invention relates to tin or tin alloy electroplating compositions comprising a suppressing agent, their use and processes for tin or tin alloy electroplating.

Metals and metal-alloys are commercially important, particularly in the electronics industry where they are often used as electrical contacts, final finishes and solders.

Leadfree solders, such as tin, tin-silver, tin-copper, tin-bismuth, tin-silver-copper, and others, are common metals used in solders. These solders are often deposited on semiconductor substrates by means of metal electroplating plating baths.

A typical tin plating solution comprises dissolved tin ions, water, an acid electrolyte such as methanesulfonic acid in an amount sufficient to impart conductivity to the bath, an antioxidant, and proprietary additives to improve the uniformity of the plating and the quality of the metal deposit in terms of surface roughness and void formation. Such additives usually include suppressing agents, also often referred to as surfactants, and grain refiners, among others.

Certain applications for lead-free solder plating present challenges in the electronics industry. For example, when used as a capping layer on copper pillars, a relatively small amount of lead-free solder, such as tin or tin-silver solder, is deposited on top of a copper pillar. In plating such small amounts of solder it is often difficult to plate a uniform height of solder composition on top of each pillar, both within a die and across the wafer. The use of known solder electroplating baths also results in deposits having a relatively rough surface morphology.

U.S. Pat. No. 4,135,991 and GB1567235 disclose a bath for electroplating tin and/or lead comprising particular alkoxylated amine brightener agents comprising polyoxyalkylene as well as a $C_8$ to $C_{22}$ or $C_{12}$ to $C_{18}$ fatty acid alkyl group, respectively.

EP2141261 A2 discloses a tin plating bath comprising a N,N-dipolyoxyalkylene-N-alkyl amine, amine oxide, or blend thereof, particularly those comprising alkyl groups with between 6 and 28 carbon atoms.

In order to provide a tin deposit that has both acceptable morphology and is substantially free of voids US 2015/122661 A1 proposes a composition for tin electroplating comprising a source of tin ions, an acid electrolyte, 0.0001 to 0.045 g/l of a particular first grain refiner, 0.005 to 0.75 g/l of an α,β-unsaturated aliphatic carbonyl compound as a second grain refiner and a nonionic surfactant. The nonionic surfactants may, besides many others, be a tetrafunctional polyethers derived from the addition of different alkylene oxides to ethylenediamine, preferably from propyleneoxide and ethyleneoxide. The alkyleneoxy moieties in the compounds may be in block, alternating or random arrangements. The mole ratio of x:y in formulae 3 and 4 is typically from 10:90 to 90:10, and preferably from 10:90 to 80:20.

The need to fit more functional units into ever-tinier spaces drives the integrated circuit industry to bump processes for package connections. A second driver is to maximize the amount of input/output connections for a given area. With decreasing diameter of and distance between the bumps the connection density can be increased. These arrays are realized with copper bumps or µ-pillars on which a tin or tin alloy solder cap is plated. In order to assure that every bump is getting contacted across a wafer tin or tin alloy solder bumps with smooth surfaces and uniform deposition height are needed.

However, there is still a need in the electronic industry for a pure tin or tin-alloy electroplating bath which leads to solder deposit with a good morphology, particularly a low roughness, in combination with an improved uniformity in height, also called coplanarity (COP).

It is an object of the present invention to provide a tin electroplating composition that provides tin or tin alloy deposits showing a good morphology, particularly a low roughness and which is capable of filling features on the micrometer scale without substantially forming defects, such as but not limited to voids. It is further an object of the invention to provide a tin or tin alloy electroplating bath that provides a uniform and planar tin or tin alloy deposit, in particular in features of 500 nanometers to 500 micrometers widths.

SUMMARY OF THE INVENTION

The present invention provides an aqueous composition comprising tin ions and at least one compound of formula I (I)

wherein
$X^1$ is selected from a linear or branched $C_1$-$C_{12}$ alkanediyl, which may optionally be interrupted by O or S or a $C_5$ to $C_{12}$ aromatic moiety,
$R^{11}$ is a copolymer of ethylene oxide and a further $C_3$ to $C_6$ alkylene oxide, wherein the content of ethylene oxide is from 5 to 30% by weight,
$R^{12}$ is selected from H, $R^{11}$, $R^{40}$,
$R^{13}$, $R^{14}$ are (a) independently selected from H, $R^{11}$, $R^{40}$, or (b) may together form a divalent group $X^{13}$;
$X^{13}$ is selected from a linear or branched $C_1$-$C_{12}$ alkanediyl, which may optionally be interrupted by O, S or $NR^{43}$;
$R^{40}$ is H or a linear or branched $C_1$-$C_{20}$ alkyl,
$R^{43}$ is selected from H, $R^{11}$ and a linear or branched $C_1$-$C_{20}$ alkyl.

The suppressing agents according to the present invention are particularly useful for filling of recessed features having aperture sizes of 500 nm to 500 µm, particularly those having aperture sizes of 1 to 200 µm.

Due to the suppressing effect of the suppressing agents dendrite growth is inhibited and smaller grain sizes and smoother surfaces are obtained with improved coplanarity of the plated tin or tin alloy solder bumps.

The invention further relates to the use of a tin or tin alloy plating bath comprising a composition as defined herein for depositing tin or tin alloys on a substrate comprising features having an aperture size of 500 nm to 500 µm.

The invention further relates to a process for depositing a tin or tin alloy layer on a substrate by
a) contacting a composition as defined herein with the substrate, and
b) applying a current to the substrate for a time sufficient to deposit a tin or tin alloy layer onto the substrate,
wherein the substrate comprises features having an aperture size of 500 nm to 500 µm and the deposition is performed to fill these features.

DETAILED DESCRIPTION OF THE INVENTION

Suppressing Agents According to the Invention

It was found that compositions for tin and tin alloy electroplating according to the invention comprising at least one suppressing agent as described below show extraordinary performance in micrometer sized feature filling. As used herein, "suppressing agents" are additives which increase the overpotential for during tin electrodeposition. There terms "surfactant" and "suppressing agent" are synonymously used herein since the suppressing agents described herein are also surface-active substances.

Besides tin ions the aqueous composition according to the present invention comprises at least one compound of formula I as further described below (I)

The compounds of formula I may be prepared by reacting a polyamine starter with one or more $C_2$ to $C_6$ alkylene oxides to form the respective amine-based suppressing agents.

The compounds of formula I may be prepared by reacting an amine starter in form of a diamine with one or more alkylene oxides.

In formula I $X^1$ is a divalent spacer group within the polyamine starter. They may independently be selected from a linear or branched $C_1$-$C_{12}$ alkanediyl. Such alkanediyl spacer are unsubstituted but may optionally be interrupted by O or S or $C_5$ to $C_{12}$ aryl. "Aryl" as used herein means a divalent mono or bicyclic $C_5$ to $C_{12}$ aromatic moiety, which may be further substituted by $C_1$ to $C_4$ alkyl, $C_1$ to $C_4$ alkoxy, $NH_2$, OH, and the like. Preferred are $C_6$ to $C_{12}$ aromatic moieties such as but not limited to benzene, and naphthalene, which may be substituted by $C_1$ to $C_4$ alkyl, $C_1$ to $C_4$ alkoxy, and the like. In a first preferred embodiment $X^1$ is a $C_1$-$C_6$ alkanediyl, more preferably $C_1$-$C_4$ alkanediyl, most preferably methanediyl, ethanediyl or propanediyl. In a second preferred embodiment an aromatic moiety is present and $X^1$ is —$(CHR^{42})_u$—Y—$(CHR^{42})_v$—. Herein Y is a divalent $C_5$ to $C_{12}$ aryl group, preferably ortho, meta or para phenylene, or toluylene, most preferably para phenylene. u and v are integers from 1 to 6, preferably from 1 to 4, most preferably 1 or 2. $R^{42}$ is selected from $C_1$ to $C_4$ alkyl, preferably methanediyl and ethanediyl. In a third preferred embodiment heteroatoms are present and $X^1$ may be —$(CHR^{41})_q$-[Q-$(CHR^{41})_r]_s$—, with Q being selected from O or S wherein q+r·s is the number of C atoms in the spacer. Particularly preferred is a spacer with Q=O and q=r=1 or 2. Most preferred spacers $X^1$ are methanediyl, ethanediyl and xylylene, particularly para xylylene.

$R^{11}$ is a copolymer of ethylene oxide and a further $C_3$ to $C_6$ alkylene oxide. Since $R^{11}$ may be prepared by polyalkoxylation of one or more alkylene oxides it is also referred to herein as "polyalkylene oxide" or "polyoxyalkylene". The further alkylene oxide may be selected from propylene oxide, butylene oxide, pentylene oxide, or hexylene oxide. The polyalkylene oxide group may be substituted by linear or branched $C_1$-$C_{20}$ alkyl, which may optionally be substituted by hydroxy, alkoxy or alkoxycarbonyl, preferably by a linear or branched $C_1$ to $C_{10}$ alkyl, more preferably by methyl, ethyl, propyl or butyl. Most preferably $R^{11}$ is an unsubstituted polyalkylene oxide.

The content of ethylene oxide in $R^{11}$ is from 5 to 30% by weight. Preferably the content of ethylene oxide in $R^{11}$ is above 6% by weight, more preferably above 8% by weight, even more preferably above 10% by weight, even more preferably above 11% by weight, even more preferably above 12% by weight. Preferably the content of ethylene oxide in $R^{11}$ is below 25% by weight, more preferably below 24% by weight, even more preferably below 22% by weight, even more preferably below 20% by weight. Preferably the content of ethylene oxide in $R^{11}$ is from 10 to 25% by weight, more preferably from 11 to 24% by weight, even more preferably from 11 to 23% by weight, even more preferably from 11 to 22% by weight, even more preferably from 11 to 21% by weight, even more preferably from 12 to 20% by weight, even more preferably from 12 to 19% by weight, even more preferably from 12 to 18% by weight.

Generally, $R^{12}$, is selected from H, $R^{11}$ and $R^{40}$, preferably from $R^{11}$ and $R^{40}$, most preferably from $R^{11}$.

In one embodiment $R^{13}$ and $R^{14}$ may be independently selected from H, $R^{11}$, $R^{40}$. In an alternative embodiment, the groups $R^{13}$ and $R^{14}$ may together form a divalent group $X^{13}$. In the latter case $X^{13}$ is selected from a linear or branched $C_1$-$C_{12}$ alkanediyl, which may optionally be interrupted by O, S or $NR^{40}$. Preferably $X^{13}$ is selected from a linear or branched $C_1$-$C_6$ alkanediyl, more preferably from a $C_1$-$C_4$ alkanediyl, most preferably from methanediyl, ethanediyl or propanediyl. In this case $X^1$ is preferably selected so as to form a 5 or 6 membered ring system.

$R^{40}$ is a linear or branched $C_1$-$C_{20}$ alkyl. Preferably $R^{40}$ is $C_1$-$C_{10}$ alkyl, even more preferably $C_1$-$C_6$ alkyl, most preferably methyl, ethyl or propyl.

$R^{41}$ is H or a linear or branched $C_1$-$C_{20}$ alkyl. Preferably $R^{41}$ is H or $C_1$-$C_{10}$ alkyl, even more preferably H or $C_1$-$C_6$ alkyl, most preferably H or methyl, ethyl or propyl.

$R^{43}$ is selected from H, $R^{11}$ and a linear or branched $C_1$-$C_{20}$ alkyl. Preferably $R^{43}$ is selected from H, $R^{11}$ and a linear or branched $C_1$-$C_{10}$ alkyl, even more preferably from H, $R^{11}$ and a linear or branched $C_1$-$C_6$ alkyl, most preferably from H and $R^{11}$.

The polyalkylene oxide groups may have random, block or alternating structure.

As used herein, "random" means that the comonomers are polymerized from a mixture and therefore arranged in a statistically manner depending on their copolymerization parameters.

As used herein, "block" means that the comonomers are polymerized after each other to form blocks of the respective co-monomers in any predefined order. By way of example, for EO and propylene oxide (PO) comonomers such blocks may be, but are not limited to: $-EO_x-PO_y$-, $-PO_x-EO_y$-, $-EO_x-PO_y-EO_z$-, $-PO_x-EO_y-PO_z$-, etc. Preferred block-type alkylene oxides are $-PO_x-EO_y$-, and $-EO_x-PO_y-EO_z$-, wherein x is in the range of 2 to 300, y is in the range of 2 to 300, and z is in the range of 2 to 300.

In a preferred embodiment, block $-PO_x-EO_y$ or $-EO_x-PO_y-EO_z$ copolymers comprising a terminal ethylene oxide block are used, wherein the PO units may be exchanged by another $C_4$ to $C_6$ alkylene oxide.

In another preferred embodiment, block $-EO_yPO_x$- or $-PO_y-EO_x-PO_z$ copolymers comprising a terminal propylene oxide block are used, wherein the PO units may be exchanged by another $C_4$ to $C_6$ alkylene oxide.

In another preferred embodiment, random $EO_x PO_y$ copolymers with statistically distributed ethylene oxide and propylene oxide are used, wherein the PO units may be exchanged by another $C_4$ to $C_6$ alkylene oxide.

Generally, the molecular weight $M_w$ of the suppressing agent may be from about 500 to about 30000 g/mol, preferably 2000 to 15000 g/mol. In one embodiment the molecular weight $M_w$ of the suppressing agent is from about 500 to about 8000 g/mol, most preferably from about 1500 to about 3500 g/mol. In another embodiment the molecular weight $M_w$ of the suppressing agent is from about 5000 to about 20000 g/mol, in particular from about 6000 to about 15000 g/mol.

In a first preferred embodiment a compound of formula I is used in which $R^{12}$, $R^{13}$, and $R^{14}$ are independently selected from a $C_2$ to $C_6$ polyoxyalkylene group $R^{11}$. Such compounds may be prepared by starting from ethylene diamine.

In a second preferred embodiment a compound of formula I is used in which $R^{12}$ is selected from $R^{11}$, the groups $R^{13}$ and $R^{14}$ together form a bivalent group selected from methanediyl, or ethanediyl and propanediyl, and $X^1$ is selected so as to form a 5 or 6 membered carbocyclic ring system. Such compounds may be prepared by starting from cyclic amines, such as but not limited to piperazine and Hexahydro-1,3,5-triazine.

In a particularly preferred embodiment $X^1$ is ethanediyl or propanediyl, and $R^{11}$, $R^{12}$, $R^{13}$, and $R^{14}$ are a polyoxyalkylene, particularly an oxyethylene-co-oxypropylene polymer.

It will be appreciated by those skilled in the art that more than one suppressing agent may be used. It is preferred to use only one or more compounds according to the present invention as suppressing agents in the plating bath composition.

A large variety of additives may typically be used in the bath to provide desired surface finishes for the plated tin or tin alloy bump. Usually more than one additive is used with each additive forming a desired function. Advantageously, the electroplating baths may contain one or more of surfactants, grain refiners, complexing agents in case of alloy deposition, antioxidants, and mixtures thereof. Most preferably the electroplating bath comprises a leveler and optionally a grain refiner in addition to the suppressing agent according to the present invention. Other additives may also be suitably used in the present electroplating baths.

Other Suppressing Agents or Surfactants

Any other nonionic surfactants may be used in the present compositions. Typically, the nonionic surfactants have an average molecular weight from 200 to 100,000, preferably from 500 to 50,000, more preferably from 500 to 25,000, and yet more preferably from 750 to 15,000. Such nonionic surfactants are typically present in the electrolyte compositions in a concentration from 1 to 10,000 ppm, based on the weight of the composition, and preferably from 5 to 10,000 ppm. Preferred alkylene oxide compounds include polyalkylene glycols, such as but not limited to alkylene oxide addition products of an organic compound having at least one hydroxy group and 20 carbon atoms or less and tetrafunctional polyethers derived from the addition of different alkylene oxides to low molecular weight polyamine compounds.

Preferred polyalkylene glycols are polyethylene glycol and polypropylene glycol. Such polyalkylene glycols are generally commercially available from a variety of sources and may be used without further purification. Capped polyalkylene glycols where one or more of the terminal hydrogens are replaced with a hydrocarbyl group may also be suitably used. Examples of suitable polyalkylene glycols are those of the formula R—O—(CXYCX'Y'O)$_n$R' where R and R' are independently chosen from H, $C_2$-$C_{20}$ alkyl group and $C_6$-$C_{20}$ aryl group; each of X, Y, X' and Y' is independently selected from hydrogen, alkyl such as methyl, ethyl or propyl, aryl such as phenyl, or aralkyl such as benzyl; and n is an integer from 5 to 100,000. Typically, one or more of X, Y, X' and Y' is hydrogen.

Suitable EO/PO copolymers generally have a weight ratio of EO:PO of from 10:90 to 90:10, and preferably from 10:90 to 80:20. Such EO/PO copolymers preferably have an average molecular weight of from 750 to 15,000. Such EO/PO copolymers are available from a variety of sources, such as those available from BASF under the tradename "PLURONIC".

Suitable alkylene oxide condensation products of an organic compound having at least one hydroxy group and 20 carbon atoms or less include those having an aliphatic hydrocarbon from one to seven carbon atoms, an unsubstituted aromatic compound or an alkylated aromatic compound having six carbons or less in the alkyl moiety, such as those disclosed in U.S. Pat. No. 5,174,887. The aliphatic alcohols may be saturated or unsaturated. Suitable aromatic compounds are those having up to two aromatic rings. The aromatic alcohols have up to 20 carbon atoms prior to derivatization with ethylene oxide. Such aliphatic and aromatic alcohols may be further substituted, such as with sulfate or sulfonate groups.

Levelers

One or more levelers may be present in the tin or tin alloy plating bath.

On class of levelers are linear or branched polyimidazolium compounds comprising the structural unit of formula L1

(L1)

Generally, $R^1$ and $R^2$ may be an H atom or an organic radical having from 1 to 20 carbon atoms. The radicals can be branched or unbranched or comprise functional groups which can, for example, contribute to further crosslinking of the polymeric imidazolium compound. Preferably, $R^1$ and $R^2$ are each, independently of one another, hydrogen atoms or hydrocarbon radicals having from 1 to 6 carbon atoms. Most preferably $R^1$ and $R^2$ are H atoms.

Generally, $R^3$ may be an H atom or an organic radical having from 1 to 20 carbon atoms. Preferably, $R^3$ is an H atom or methyl, ethyl or propyl. Most preferably $R^3$ is an H atom.

Generally, $X^1$ may be a linear, branched or cyclic aliphatic diradical selected from a $C_4$ to $C_{20}$ alkandiyl, which may comprise one or more continuations of the imidazolium compound by branching.

As used herein, "continuation of the polyimidazolium compound by branching" means that the respective spacer group $X^1$ comprises one or more, preferably one or two, groups from which a polyimidazole branch is started. Preferably, $X^1$ does not comprise any continuation of the polyimidazolium compound by branching, i.e. the polyimidazolium compound is a linear polymer.

In a first embodiment $X^1$ is $C_4$ to $C_{14}$ alkanediyl, most preferably $C_4$ to $C_{12}$ alkanediyl, which may be unsubstituted or substituted by $OR^4$, $NR^4_2$, and $SR^4$, in which $R^4$ is a $C_1$ to $C_4$ alkyl group. In a particular embodiment, $X^1$ is a pure hydrocarbon radical which does not comprise any functional groups.

Particularly preferred groups $X^1$ are selected from a linear or branched butanediyl, pentanediyl, hexanediyl, heptanediyl, octanediyl, nonanediyl, decanediyl, undecanediyl, and dodecanediyl, which may be unsubstituted or substituted by $OR^4$, $NR^4$. Particularly preferred groups $X^1$ are selected from linear butanediyl, hexanediyl and octanediyl.

In second embodiment, group $X^1$ may be a cyclic alkanediyl of formula wherein
$X^2$ is independently selected from a $C_1$ to $C_4$ alkandiyl, which may be interrupted by one or two selected from O and $NR^4$, and
$X^3$ is independently selected from (a) a chemical bond or (b) a $C_1$ to $C_4$ alkandiyl, which may be interrupted by O or $NR^4$,
wherein $R^4$ is a $C_1$ to $C_4$ alkyl group.

As used herein, "chemical bond" means that the respective moiety is not present but that the adjacent moieties are bridged so as to form a direct chemical bond between these adjacent moieties. By way of example, if in X—Y—Z the moiety Y is a chemical bond then the adjacent moieties X and Z together form a group X—Z.

Either $X^2$ or $X^3$ or both $X^2$ and $X^3$ may comprise one or more continuations of the imidazolium compound by branching, preferably only $X^2$ may comprise such continuations of the imidazolium compound by branching.

In this second embodiment, most preferably one $X^2$ is selected from methanediyl and the other $X^2$ is selected from propanediyl or both $X^2$ are selected from ethanediyl. Particularly preferred are groups $X^1$ are selected from isophoronediamine, biscyclohexyldiamino methane, and methyl-cyclohexyl-diamine (MDACH).

In a third embodiment, $X^1$ may be a (hetero)arylalkyl diradical selected from $Y^2$—$Y^1$—$Y^2$. Herein $Y^1$ may be a $C_5$ to $C_{20}$ aryl group and $Y^2$ may be independently selected from a linear or branched $C_1$ to $C_6$ alkanediyl. Also here, both, $Y^1$ and $Y^2$ may comprise one or more continuations of the imidazolium compound by branching.

Preferred groups $Y^1$ are selected from phenyl, naphtyl, pyridyl, pyrimidyl, and furanyl, most preferably phenyl. Preferred groups $Y^2$ are selected from a linear or branched $C_1$ to $C_4$ alkanediyl, preferably from methanediyl, ethanediyl, 1,3-propanediyl and 1,4-butanediyl.

The organic radical $X^1$ may comprise not only carbon and hydrogen but also heteroatoms such as oxygen, nitrogen, sulfur or halogens, e.g. in the form of functional groups such as hydroxyl groups, ether groups, amide groups, aromatic heterocycles, primary, secondary, or tertiary amino groups or imino groups.

In particular, the organic radical $X^1$ may be a hydrocarbon diradical which may be substituted or interrupted by functional groups comprising heteroatoms, in particular ether groups. If substituted, it is preferred that $X^1$ does not comprise any hydroxyl groups.

n may generally be an integer from 2 to about 5000, preferably from about 5 to about 3000, even more preferably from about 8 to about 1000, even more preferably from about 10 to about 300, even more preferably from about 15 to about 250, most preferably from about 25 to about 150.

The mass average molecular weight $M_w$ of the additive may generally be from 500 g/mol to 1,000,000 g/mol, preferably from 1000 g/mol to 500,000 g/mol, more preferably from 1500 g/mol to 100,000 g/mol, even more preferably from 2,000 g/mol to 50,000 g/mol, even more preferably from 3,000 g/mol to 40,000 g/mol, most preferably from 5,000 g/mol to 25,000 g/mol.

Preferably the at least one additive comprises a counterion $Y^{o-}$, wherein o is a positive integer selected so that the overall additive is electrically neutral. Preferably o is 1, 2 or 3. Most preferably, the counterion $Y^{o-}$ is selected from chloride, sulfate, methanesulfonate or acetate.

Preferably the number average molecular weight $M_n$ of the polymeric imidazolium compound, determined by gel permeation chromatography, is be greater than 500 g/mol.

Preferably the polymeric imidazolium compound may comprise more than 80% by weight of structural units of the formula L1.

More details and alternatives are described in unpublished European patent application No. 17173987.3, patent publication WO 2016/020216 and International Patent Application No. PCT/EP2017/050054, respectively, which are incorporated herein by reference.

Other suitable leveling agents include, but are not limited to, polyaminoamide and derivatives thereof, polyalkanolamine and derivatives thereof, polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, or compounds containing a functional group of the formula N—R—S, where R is a substituted alkyl, unsubstituted alkyl, substituted aryl or unsubstituted aryl. Typically, the alkyl groups are $C_1$-$C_6$ alkyl and preferably $C_1$-$C_4$ alkyl. In general, the aryl groups include $C_6$-$C_{20}$ aryl, preferably $C_6$-$C_{12}$ aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, $C_1$-$C_{12}$ alkyl, $C_2$-$C_{12}$ alkenyl, $C_6$-$C_{20}$ aryl, $C_1$-$C_{12}$ alkylthio, $C_2$-$C_{12}$ alkenylthio, $C_6$-$C_{20}$ arylthio and the like. Likewise, the nitrogen will have one or more substituent groups, such as but not limited to hydrogen, $C_1$-$C_{12}$ alkyl, $C_2$-$C_{12}$ alkenyl, $C_7$-$C_{10}$ aryl, and the like. The N—R—S functional group may be acyclic or cyclic. Compounds containing cyclic N—R—S functional groups include those having either the nitrogen or the sulfur or both the nitrogen and the sulfur within the ring system.

Further leveling agents are triethanolamine condensates as described in unpublished international Patent Application No. PCT/EP2009/066581.

In general, the total amount of leveling agents in the electroplating bath is from 0.5 ppm to 10000 ppm based on the total weight of the plating bath. The leveling agents according to the present invention are typically used in a total amount of from about 100 ppm to about 10000 ppm based on the total weight of the plating bath, although greater or lesser amounts may be used.

Grain Refiners

The tin or tin alloy electroplating bath may further contain grain refiners. Grain refiners may be chosen from a compound of formula G1 or G2 wherein each $R^1$ is independently $C_1$ to $C_6$ alkyl, $C_1$ to $C_6$ alkoxy, hydroxy, or halogen; $R^2$ and $R^3$ are independently selected from H and $C_1$ to $C_6$ alkyl; $R^4$ is H, OH, $C_1$ to $C_6$ alkyl or $C_1$ to $C_6$ alkoxy; m is an integer from 0 to 2; each $R^5$ is independently $C_1$ to $C_6$ alkyl; each $R^6$ is independently chosen from H, OH, $C_1$ to $C_6$ alkyl, or $C_1$ $C_6$ alkoxy; n is 1 or 2; and p is 0, 1 or 2.

Preferably, each $R^1$ is independently $C_1$ to $C_6$ alkyl, $C_1$ to $C_3$ alkoxy, or hydroxy, and more preferably $C_1$ to $C_4$ alkyl, $C_1$ to $C_2$ alkoxy, or hydroxy. It is preferred that $R^2$ and $R^3$ are independently chosen from H and $C_1$ to $C_3$ alkyl, and more preferably H and methyl. Preferably, $R^4$ is H, OH, $C_1$ to $C_4$ alkyl or $C_1$ to $C_4$ alkoxy, and more preferably H, OH, or $C_1$ to $C_4$ alkyl. It is preferred that $R^5$ is $C_1$ to $C_4$ alkyl, and more preferably $C_1$ to $C_3$ alkyl. Each $R^6$ is preferably chosen from H, OH, or C1 to $C_6$ alkyl, more preferably H, OH, or $C_1$ to $C_3$ alkyl, and yet more preferably H or OH. It is preferred that m is 0 or 1, and more preferably m is 0. Preferably, n is 1. It is preferred that p is 0 or 1, and more preferably p is 0. A mixture of first grain refiners may be used, such as two different grain refiners of formula 1, 2 different grain refiners of formula 2, or a mixture of a grain refiner of formula 1 and a grain refiner of formula 2.

Exemplary compounds useful as such grain refiners include, but are not limited to, cinnamic acid, cinnamaldehyde, benzalacetone, picolinic acid, pyridinedicarboxylic acid, pyridinecarboxaldehyde, pyridinedicarboxaldehyde, or mixtures thereof. Preferred grain refiners include benzalacetone, 4-methoxy benzaldehyde, benzylpyridin-3-carboxylate, and 1,10-phenantroline.

Further grain refiners may be chosen from an α,β-unsaturated aliphatic carbonyl compound. Suitable α,β-unsaturated aliphatic carbonyl compound include, but are not limited to, α,β-unsaturated carboxylic acids, α,β-unsaturated carboxylic acid esters, α,β-unsaturated amides, and α,β-unsaturated aldehydes. Preferably, such grain refiners are chosen from α,β-unsaturated carboxylic acids, α,β-unsaturated carboxylic acid esters, and α,β-unsaturated aldehydes, and more preferably α,β-unsaturated carboxylic acids, and α,β-unsaturated aldehydes. Exemplary α,β-unsaturated aliphatic carbonyl compounds include (meth)acrylic acid, crotonic acid, C to C6 alkyl meth)acrylate, (meth)acrylamide, $C_1$ to $C_6$ alkyl crotonate, crotonamide, crotonaldehyde, (meth)acrolein, or mixtures thereof. Preferred α,β-unsaturated aliphatic carbonyl compounds are (meth)acrylic acid, crotonic acid, crotonaldehyde, (meth) acrylaldehyde or mixtures thereof.

In one embodiment, grain refiners may be present in the plating baths in an amount of 0.0001 to 0.045 g/l. Preferably, the grain refiners are present in an amount of 0.0001 to 0.04 g/l, more preferably in an amount of 0.0001 to 0.035 g/l, and yet more preferably from 0.0001 to 0.03 g/l. Compounds useful as the first grain refiners are generally commercially available from a variety of sources and may be used as is or may be further purified.

In another more preferred embodiment, the compositions for tin or tin alloy electroplating do comprises a single grain refiner, more preferably a single grain refiner that is no α,β-unsaturated aliphatic carbonyl compound, most preferably essentially no grain refiner or no grain refiner at all. Surprisingly, it was found that particularly for filling recessed features having an aperture size below 50 μm there is no need to use any grain refiners but the suppressing agent leads to a good coplanarity without the use of any grain refiner.

The present compositions may optionally include further additives, such as antioxidants, organic solvents, complexing agents, and mixtures thereof.

Antioxidants

Antioxidants may optionally be added to the present composition to assist in keeping the tin in a soluble, divalent state. It is preferred that one or more antioxidants are used in the present compositions. Exemplary antioxidants include, but are not limited to, hydroquinone, and hydroxylated and/or alkoxylated aromatic compounds, including sulfonic acid derivatives of such aromatic compounds, and preferably are: hydroquinone; methylhydroquinone; resorcinol; catechol; 1,2,3-trihydroxybenzene; 1,2-dihydroxybenzene-4-sulfonic acid; 1,2-dihydroxybenzene-3,5-disulfonic acid; 1,4-dihydroxybenzene-2-sulfonic acid; 1,4-dihydroxybenzene-2,5-disulfonic acid; 2,4-dihydroxybenzene sulfonic acid, and p-Methoxyphenol. Such antioxidants are disclosed in U.S. Pat. No. 4,871,429. Other suitable antioxidants or reducing agents include, but are not limited to, vanadium compounds, such as vanadylacetylacetonate, vanadium triacetylacetonate, vanadium halides, vanadium oxyhalides, vanadium alkoxides and vanadyl alkoxides. The concentration of such reducing agent is well known to those skilled in the art, but is typically in the range of from 0.1 to 10 g/l, and preferably from 1 to 5 g/l. Such antioxidants are generally commercially available from a variety of sources.

Complexing Agents

The tin or tin alloy electroplating bath may further contain complexing agents for complexing tin and/or any other metal present in the composition. A typical complexing agent is 3,6-Dithia-1,8-octanediol.

Typical complexing agents are polyoxy monocarboxylic acids, polycarboxylic acids, aminocarboxylic acids, lactone compounds, and salts thereof.

Other complexing agents are organic thiocompounds like thiourea, thiols or thioethers as disclosed in U.S. Pat. No. 7,628,903, JP 4296358 B2, EP 0854206 A and U.S. Pat. No. 8,980,077 B2.

Electrolyte

In general, as used herein "aqueous" means that the present electroplating compositions comprises a solvent comprising at least 50% of water. Preferably, "aqueous" means that the major part of the composition is water, more preferably 90% of the solvent is water, most preferably the solvent essentially consists of water. Any type of water may be used, such as distilled, deionized or tap.

Tin

The tin ion source may be any compound capable of releasing metal ions to be deposited in the electroplating bath in sufficient amount, i.e. is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like.

The metal ion source may be used in the present invention in any amount that provides sufficient metal ions for electroplating on a substrate. When the metal is solely tin, the tin salt is typically present in an amount in the range of from about 1 to about 300 g/l of plating solution. In a preferred embodiment the plating solution is free of lead, that is, they contain 1 wt % lead, more preferably below 0.5 wt %, and yet more preferably below 0.2 wt %, and still more preferably are free of lead. In another a preferred embodiment the plating solution is essentially free of copper, that is, they contain 1 wt % copper, more preferably below 0.1 wt %, and yet more preferably below 0.01 wt %, and still more preferably are free of copper.

Alloying Metals

Optionally, the plating baths according to the invention may contain one or more alloying metal ions. Suitable alloying metals include, without limitation, silver, gold, copper, bismuth, indium, zinc, antimony, manganese and mixtures thereof. Preferred alloying metals are silver, copper, bismuth, indium, and mixtures thereof, and more preferably silver. Any bath-soluble salt of the alloying metal may suitably be used as the source of alloying metal ions. Examples of such alloying metal salts include, but are not limited to: metal oxides; metal halides; metal fluoroborate; metal sulfates; metal alkanesulfonates such as metal methanesulfonate, metal ethanesulfonate and metal propanesulfonate; metal arylsulfonates such as metal phenylsulfonate, metal toluenesulfonate, and metal phenolsulfonate; metal carboxylates such as metal gluconate and metal acetate; and the like. Preferred alloying metal salts are metal sulfates; metal alkanesulfonates; and metal arylsulfonates. When one alloying metal is added to the present compositions, a binary alloy deposit is achieved. When 2, 3 or more different alloying metals are added to the present compositions, tertiary, quaternary or higher order alloy deposits are achieved. The amount of such alloying metal used in the present compositions will depend upon the particular tin-alloy desired. The selection of such amounts of alloying metals is within the ability of those skilled in the art. It will be appreciated by those skilled in the art that when certain alloying metals, such as silver, are used, an additional complexing agent may be required. Such complexing agents (or complexers) are well-known in the art and may be used in any suitable amount to achieve the desired tin-alloy composition.

The present electroplating compositions are suitable for depositing a tin-containing layer, which may be a pure tin layer or a tin-alloy layer. Exemplary tin-alloy layers include, without limitation, tin-silver, tin-copper, tin-indium, tin-bismuth, tin-silver-copper, tin-silver-copper-antimony, tin-silver-copper-manganese, tin-silver-bismuth, tin-silver-indium, tin-silver-zinc-copper, and tin-silver-indium-bismuth. Preferably, the present electroplating compositions deposit pure tin, tin-silver, tin-silver-copper, tin-indium, tin-silver-bismuth, tin-silver-indium, and tin-silver-indium-bismuth, and more preferably pure tin, tin-silver or tin-copper.

Alloys deposited from the present electroplating bath contain an amount of tin ranging from 0.01 to 99.99 wt %, and an amount of one or more alloying metals ranging from 99.99 to 0.01 wt %, based on the weight of the alloy, as measured by either atomic adsorption spectroscopy (AAS), X-ray fluorescence (XRF), inductively coupled plasma mass spectrometry (ICP-MS). Preferably, the tin-silver alloys deposited using the present invention contain from 90 to 99.99 wt % tin and 0.01 to 10 wt % of silver and any other alloying metal. More preferably, the tin-silver alloy deposits contain from 95 to 99.9 wt % tin and 0.1 to 5 wt % of silver and any other alloying metal. Tin-silver alloy is the preferred tin-alloy deposit, and preferably contains from 90 to 99.9 wt % tin and from 10 to 0.1 wt % silver. More preferably, the tin-silver alloy deposits contain from 95 to 99.9 wt % tin and from 5 to 0.1 wt % silver. For many applications, the eutectic composition of an alloy may be used. Alloys deposited according to the present invention are substantially free of lead, that is, they contain 1 wt % lead, more preferably below 0.5 wt %, and yet more preferably below 0.2 wt %, and still more preferably are free of lead.

Bath

In general, besides the metal ion source and at least one of the suppressing agents, the present metal electroplating compositions preferably include electrolyte, i. e. acidic or alkaline electrolyte, one or more sources of metal ions, optionally halide ions, and optionally other additives like surfactants and grain refiners. Such baths are typically aqueous. The water may be present in a wide range of amounts. Any type of water may be used, such as distilled, deionized or tap.

Preferably, the plating baths of the invention are acidic, that is, they have a pH below 7. Typically, the pH of the tin or tin alloy electroplating composition is below 4, preferably below 3, most preferably below 2.

The electroplating baths of the present invention may be prepared by combining the components in any order. It is preferred that the inorganic components such as metal salts, water, electrolyte and optional halide ion source, are first added to the bath vessel followed by the organic components such as surfactants, grain refiners, levelers and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/l.

In one embodiment the at least one additive comprises a counterion $Y^{o-}$ selected from methane sulfonate, sulfate or acetate. wherein o is a positive integer.

Such electrolytes may optionally contain a source of halide ions, such as chloride ions as in tin chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

Application

The plating compositions of the present invention are useful in various plating methods where a tin-containing layer is desired, and particularly for depositing a tin-containing solder layer on a semiconductor wafer comprising a plurality of conductive bonding features. Plating methods include, but are not limited to, horizontal or vertical wafer plating, barrel plating, rack plating, high speed plating such as reel-to-reel and jet plating, and reckless plating, and preferably horizontal or vertical wafer plating. A wide variety of substrates may be plated with a tin-containing deposit according to the present invention. Substrates to be plated are conductive and may comprise copper, copper alloys, nickel, nickel alloys, nickel-iron containing materials. Such substrates may be in the form of electronic components such as (a) lead frames, connectors, chip capacitors, chip resistors, and semiconductor packages, (b) plastics such as circuit boards, and (c) semiconductor wafers. Preferably the substrates are semiconductor wafers. Accordingly, the present invention also provides a method of depositing a tin-containing layer on a semiconductor wafer comprising: providing a semiconductor wafer comprising a plurality of conductive bonding features; contacting the semiconductor wafer with the composition described above; and applying sufficient current density to deposit a tin-containing layer on the conductive bonding features. Preferably, the bonding features comprise copper, which may be in the form of a pure copper layer, a copper alloy layer, or any interconnect structure comprising copper. Copper pillars are one preferred conductive bonding feature. Optionally, the copper pillars may comprise a top metal layer, such as a nickel layer. When the conductive bonding features have a top metal layer, then the pure tin solder layer is deposited on the top metal layer of the bonding feature. Conductive bonding features, such as bonding pads, copper pillars, and the like, are well-known in the art, such as described in U.S. Pat. No. 7,781,325, US 2008/0054459 A, US 2008/0296761 A, and US 2006/0094226 A.

Process

In general, when the present invention is used to deposit tin or tin alloys on a substrate the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

The tin or tin alloy is deposited in recesses according to the present invention without substantially forming voids within the metal deposit. By the term "without substantially forming voids", it is meant that there are no voids in the metal deposit which are bigger than 1000 nm, preferably 500 nm, most preferably 100 nm.

Plating equipment for plating semiconductor substrates are well known. Plating equipment comprises an electroplating tank which holds tin or tin alloy electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings.

These additives can be used with soluble and insoluble anodes in the presence or absence of a membrane or membranes separating the catholyte from the anolyte.

The cathode substrate and anode are electrically connected by wiring and, respectively, to a power supply. The cathode substrate for direct or pulse current has a net negative charge so that the metal ions in the solution are reduced at the cathode substrate forming plated metal on the cathode surface. An oxidation reaction takes place at the anode. The cathode and anode may be horizontally or vertically disposed in the tank.

In general, when preparing tin or tin alloy bumps, a photoresist layer is applied to a semiconductor wafer, followed by standard photolithographic exposure and development techniques to form a patterned photoresist layer (or plating mask) having openings or vias therein. The dimensions of the plating mask (thickness of the plating mask and the size of the openings in the pattern) defines the size and location of the tin or tin alloy layer deposited over the I/O pad and UBM. The diameter of such deposits typically range from 1 to 300 μm, preferably in the range from 2 to 100 μm.

All percent, ppm or comparable values refer to the weight with respect to the total weight of the respective composition except where otherwise indicated. All cited documents are incorporated herein by reference.

The following examples shall further illustrate the present invention without restricting the scope of this invention.

Analytical Methods

The molecular weight of the suppressing agents was determined by size-exclusion chromatography (SEC). Polystyrene was used as standard and tetrahydrofuran as effluent. The temperature of the column was 30° C., the injected volume 30 μL (μliter) and the flow rate 1.0 ml/min. The weight average molecular weight ($M_w$), the number average molecular weight ($M_n$) and the polydispersity PDI ($M_w/M_n$) of the suppressing agent were determined.

The amine number was determined according to DIN 53176 by titration of a solution of the polymer in acetic acid with perchloric acid.

Coplanarity and morphology (roughness) was determined by measuring the height of the substrate by laser scanning microscopy.

The patterned photoresist contained vias of 8 µm diameter and 15 µm depth and pre-formed copper µ-bump of 5 µm height. The isolated (iso)-area consists of a 3×6 array of pillars with a center to center distance (pitch) of 32 µm. The dense area consists of an 8×16 array of pillars with a center to center distance (pitch) of 16 µm. For the calculation of the within die coplanarity 3 bumps of the iso-area and 3 bumps from the center of the dense area are taken.

The Within Die (WID) coplanarity (COP) was determined by using formula $$COP=(H_{iso}-H_{dense})/H_{Av}$$

Herein $H_{iso}$ and $H_{dense}$ are the average heights of the bumps in the iso/dense area and $H_{Av}$ is the overall average height of all bumps in the iso and dense area as described above.

The Average Roughness $R_a$ was calculated by using formula $$R_a = \frac{1}{n}\sum_{i=1}^{n}|H_i - H_{mean}|$$

Herein $H_i$ is the height of location i on a certain bump. During a laser scan of the surface of one bump the height of n locations is determined. $H_{mean}$ is the average height of all n locations of one bump.

EXAMPLES

Example 1: Suppressor Preparation

Example 1.3

Ethylenediamine (177 g) were placed into a 3.5 l autoclave. After nitrogen neutralization, the pressure was adjusted to 0.5 bar. Then propylene oxide (684.4 g) was added at 100° C. over a period of 12 h, reaching a maximum pressure of 5 bar. To complete the reaction, the mixture post-react for 6 h at 100° C. Then, the temperature was decreased to 80° C. and volatile compounds were removed in vacuum at 80° C. A yellow intermediate product (849.4 g) having an amine number of 6.5 mmol/g.

The intermediate product (300 g) and potassium tert-butoxide (3.5 g) were placed into a 3.5 l autoclave. After nitrogen neutralization, the pressure was adjusted to 1.0 bar and the mixture was homogenized at 130° C. for 1 h. Then propylene oxide (1813 g) was added at 130° C. over a period of 14 h, reaching a maximum pressure of 5 bar. The mixture post reacts for 10 h. Afterwards ethylene oxide (458.7 g) was added at 130° C. over a period of 6 h, reaching a maximum pressure of 5 bar. To complete the reaction, the mixture post-react for 8 h at 130° C. Then, the temperature was decreased to 80° C. and volatile compounds were removed in vacuum at 80° C.

Surfactant 3 was obtained as orange liquid (2524.5 g) having an amine number of 0.8 mmol/g, an EO content of 10% by weight (in relation to the sum of EO and PO) and a molecular weight Mw of 2252 g/mol.

Example 1.4

Hexamethylenediamine (200 g) were placed into a 3.5 l autoclave. After nitrogen neutralization, the pressure was adjusted to 0.5 bar. Then ethylene oxide (303.2 g) was added at 100° C. over a period of 3 h, reaching a maximum pressure of 4 bar. To complete the reaction, the mixture post-react for 6 h at 100° C. Then, the temperature was decreased to 80° C. and volatile compounds were removed in vacuum at 80° C. A yellow intermediate product (488.3 g) having an amine number of 6.6 mmol/g.

The intermediate product (100 g) and potassium hydroxide (2.2 g) were placed into a 3.5 l autoclave. After nitrogen neutralization, the pressure was adjusted to 1.0 bar and the mixture was homogenized at 130° C. for 1 h. Then ethylene oxide (165.7 g) was added at 130° C. over a period of 6 h, reaching a maximum pressure of 3 bar. The mixture post reacts for 14 h. Afterwards propylene oxide (834.2 g) was added at 130° C. over a period of 10 h, reaching a maximum pressure of 7 bar. To complete the reaction, the mixture post-reacts for 8 h at 130° C. Then, the temperature was decreased to 80° C. and volatile compounds were removed in vacuum at 80° C.

Surfactant 4 was obtained as yellow, viscous liquid (1065 g) having an amine number of 0.621 mmol/g, an EO content of 21% by weight (in relation to the sum of EO and PO) and a molecular weight Mw of 3216 g/mol.

Example 1.5

Ethylenediamine (177 g) were placed into a 3.5 l autoclave. After nitrogen neutralization, the pressure was adjusted to 0.5 bar. Then propylene oxide (684.2 g) was added at 100° C. over a period of 12 h, reaching a maximum pressure of 5 bar. To complete the reaction, the mixture post-react for 6 h at 100° C. Then, the temperature was decreased to 80° C. and volatile compounds were removed in vacuum at 80° C. A yellow intermediate product (861.2 g) having an amine number of 6.4 mmol/g The intermediate product (71 g) and potassium tert-butoxide (1.2 g) were placed into a 3.5 l autoclave. After nitrogen neutralization, the pressure was adjusted to 1.0 bar and the mixture was homogenized at 130° C. for 1 h. Then propylene oxide (564.1 g) was added at 130° C. over a period of 10 h, reaching a maximum pressure of 5 bar. The mixture post reacts for 14 h. Afterwards ethylene oxide (139.1 g) was added at 130° C. over a period of 4 h, reaching a maximum pressure of 5 bar. To complete the reaction, the mixture post-reacts for 8 h at 130° C. Then, the temperature was decreased to 80° C. and volatile compounds were removed in vacuum at 80° C.

Surfactant 5 was obtained as orange liquid (774.1 g) having an amine number of 0.62 mmol/g, an EO content of 18% by weight (in relation to the sum of EO and PO) and a molecular weight Mw of 3184 g/mol.

Example 1.6

Ethylenediamine (210 g) were placed into a 3.5 l autoclave. After nitrogen neutralization, the pressure was adjusted to 0.5 bar. Then ethylene oxide (616.8 g) was added at 100° C. over a period of 9 h, reaching a maximum pressure of 5 bar. To complete the reaction, the mixture post-react for 6 h at 100° C. Then, the temperature was decreased to 80° C. and volatile compounds were removed in vacuum at 80° C. A yellow intermediate product (827.1 g) having an amine number of 7.9 mmol/g.

The intermediate product (45.3 g) and potassium tert-butoxide (1.3 g) were placed into a 3.5 l autoclave. After nitrogen neutralization, the pressure was adjusted to 1.0 bar and the mixture was homogenized at 130° C. for 1 h. Then propylene oxide (740.5 g) and ethylene oxide (121.1 g) were added at 130° C. over a period of 6 h, reaching a maximum pressure of 5 bar. To complete the reaction, the mixture post-reacts for 12 h at 130° C. Then, the temperature was decreased to 80° C. and volatile compounds were removed in vacuum at 80° C.

Surfactant 6 was obtained as an orange liquid (774.1 g) having an amine number of 0.56 mmol/g, an EO content of 18% by weight (in relation to the sum of EO and PO) and a molecular weight Mw of 3678 g/mol.

Example 1.7 p-Xylenediamine (509 g) was placed under nitrogen atmosphere into a 3.5 l autoclave and heated up to 100° C. Then ethylene oxide (669 g) was added over a period of 10 h. The mixture was allowed to post react for 6 h. A yellow intermediate product (1179 g) having an hydroxid number of 748 mg/g was obtained.

The intermediate product (312.4 g) and potassium tert-butoxide (3.5 g) were placed into a 3.5 l autoclave. After nitrogen neutralization, the pressure was adjusted to 1.5 bar and the mixture was homogenized at 130° C. for 1 h. Then ethylene oxide (44.1 g) was added at 130° C. over a period of 12 h, reaching a maximum pressure of 6 bar. The mixture was allowed to post react for 10 h. Afterwards propylene oxide (1974.7 g) was added at 130° C. over a period of 18 h, reaching a maximum pressure of 5 bar. To complete the reaction, the mixture was allowed to post-react for 12 h at 130° C. Then, the temperature was decreased to 80° C. and volatile compounds were removed in vacuum at 80° C.

Surfactant 6 was obtained as orange liquid (2189.8 g) having an hydroxide number of 96 mg/g.

Example 1.8 p-Xylenediamine (509 g) was placed under nitrogen atmosphere into a 3.5 l autoclave and heated up to 100° C. Then ethylene oxid (669 g) was added over a period of 10 h. The mixture was allowed to post react for 6 h. A yellow intermediate product (1179 g) having an hydroxid number of 748 mg/g was obtained.

The intermediate product (93.7 g) and potassium tert-butoxide (1.2 g) were placed into a 3.5 l autoclave. After nitrogen neutralization, the pressure was adjusted to 1.5 bar and the mixture was homogenized at 130° C. for 1 h. Then ethylene oxide (79.3 g) and propylene oxid (592.4 g) were added at 130° C. over a period of 10 h, reaching a maximum pressure of 6 bar. To complete the reaction, the mixture was allowed to post-react for 6 h at 130° C. Then, the temperature was decreased to 80° C. and volatile compounds were removed in vacuum at 80° C.

Surfactant 7 was obtained as orange liquid (716.8 g) having a hydroxide number of 98 mg/g.

Example 2: Tin Electroplating

Comparative Example 2.1

A tin plating bath containing 40 g/l tin as tin methanesulfonate, 165 g/l methanesulfonic acid, 1 g/l of a commercial anti-oxidant and 1 g/l Lugalvan® BNO 12 (a common state of the art surfactant for tin plating, available from BASF) has been prepared. Lugalvan® BNO 12 is β-naphthol ethoxylated with 12 moles ethylene oxide per mole β-naphthol.

3.5 μm tin was electroplated on a nickel covered copper micro-bump. The copper micro-bump had a diameter of 8 μm and a height of 5 μm. The nickel layer was 1 μm thick. A 2 cm×2 cm large wafer coupon with a 15 μm thick patterned photo resist layer has been immersed in the above described plating bath and a direct current of 11 ASD (amperes per square dm, 1 ASD=10 mA/cm2) has been applied for 37 s at 25° C.

The plated tin bump was examined with a laser scanning microscope (LSM) and scanning electron microscopy (SEM). A mean roughness ($R_a$) of 0.4 μm and a coplanarity (COP) of 4% has been determined.

Figure 1:
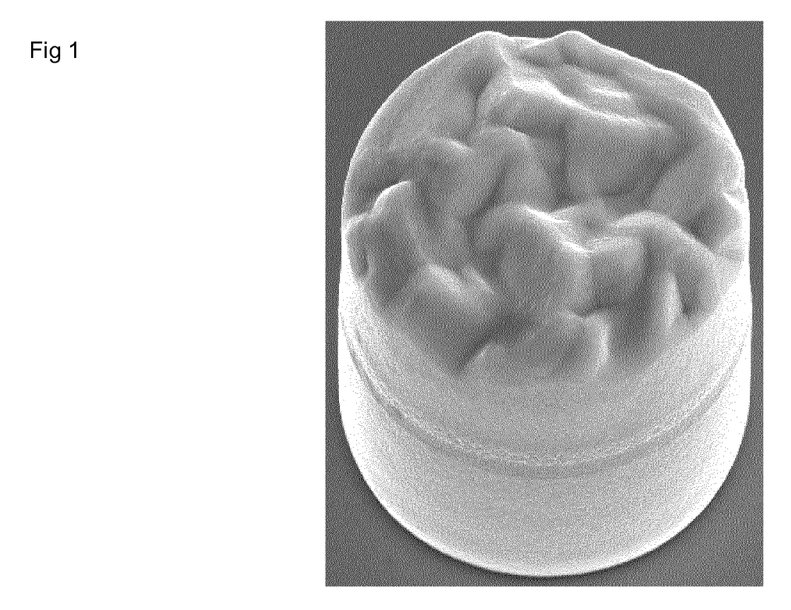
FIG. 1 shows a SEM image of a tin bump electroplated according to Comparative Example 2.1.

As can be derived from FIG. 1 in comparison to the other figures and by comparing the mean roughness ($R_a$) of 0.4 μm to $R_a$ of the other examples electroplating using Lugalvan BNO 12 results in a rough surface of the tin bump.

Comparative Example 2.2

A tin plating bath as described for Comparative Example 2.1 containing additional 0.02 g/l benzalacetone (a grain refiner) and 10 m/l isopropanol has been prepared. The plating procedure was the one described in Comparative Example 2.1. The plated tin bump was examined with a laser scanning microscope (LSM) and scanning electron microscopy (SEM). A mean roughness ($R_a$) of 0.12 μm and a coplanarity (COP) of −11% has been determined.

Figure 2:
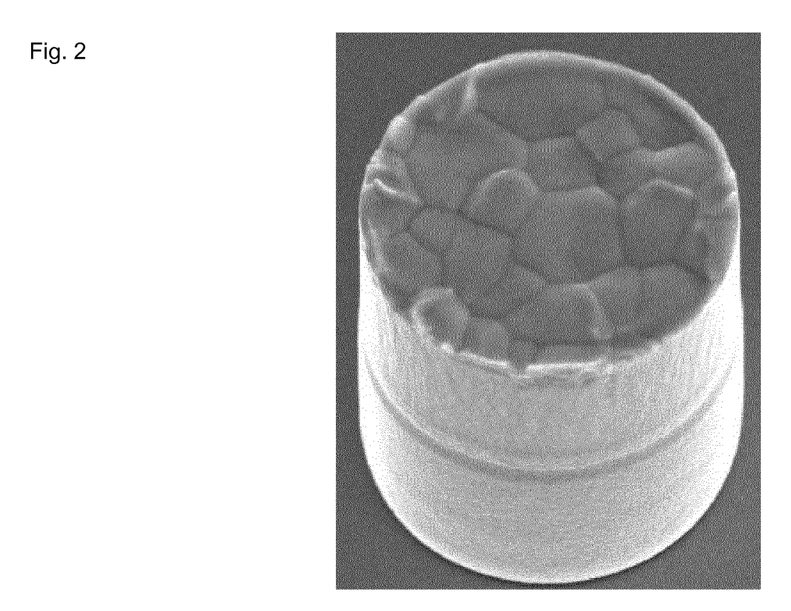
FIG. 2 shows a SEM image of a tin bump electroplated according to Comparative Example 2.2.

As can be derived from FIG. 2 presence of benzalacetone in Comparative Example 2.2 leads to a reduced surface roughness but with a negative impact to the coplanarity, i.e. less uniform plating heights, compared to Comparative Example 2.1.

Example 2.3

A tin plating bath as described for Comparative Example 2.1 containing 1 g/l Surfactant 3 instead of Lugalvan BNO12 was prepared. The plating procedure was the one described in Comparative Example 2.1. The plated tin bump was examined with a laser scanning microscope (LSM) and scanning electron microscopy (SEM). A mean roughness (Ra) of 0.14 μm and a coplanarity (COP) of 2% has been determined.

Figure 3:
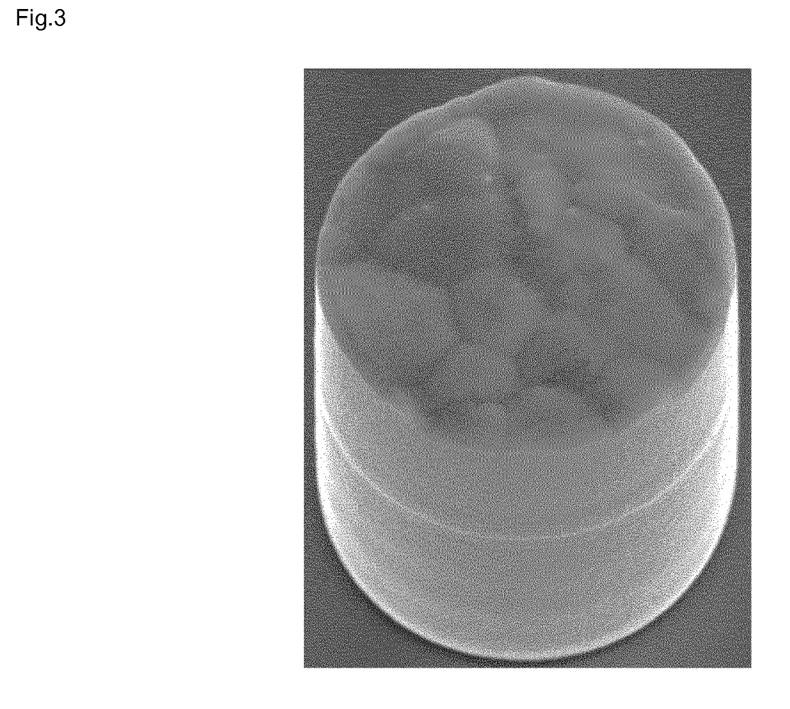
FIG. 3 shows a SEM image of a tin bump electroplated according to Example 2.3.

The results are summarized in Table 1 and depicted in FIG. 3.

Comparing the results from Examples 2.1 (FIG. 1) and 2.3 (FIG. 3), tin electroplating leads to a much smoother surface when using Surfactant 3 compared to Lugalvan BNO12.

Furthermore, a comparison of the results of Examples 2.2 (FIG. 2) and 2.3 (FIG. 3) shows that tin electroplating leads to a much better coplanarity when using Surfactant 3 compared to the combination of Lugalvan BNO12 and benzylidene acetone as grain refiner.

Example 2.4

A tin plating bath as described for Comparative Example 2.1 containing 1 g/l Surfactant 4 instead of Lugalvan BNO12 was prepared. The plating procedure was the one described in Comparative Example 2.1. The plated tin bump was examined with a laser scanning microscope (LSM) and scanning electron microscopy (SEM). A mean roughness (Ra) of 0.16 μm and a coplanarity (COP) of 1% was determined.

Figure 4:
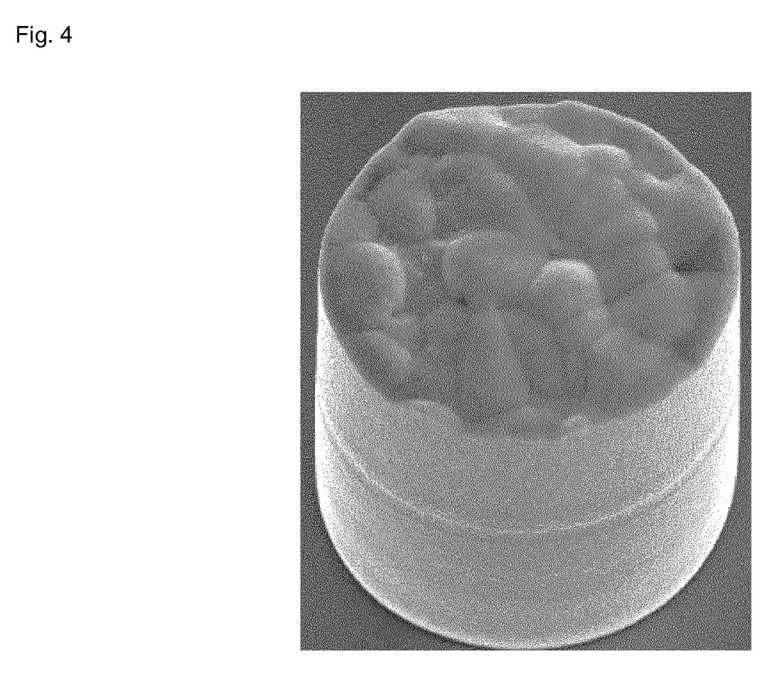
FIG. 4 shows a SEM image of a tin bump electroplated according to Example 2.4.

The results are summarized in Table 1 and depicted in FIG. 4.

Using Surfactant 4 instead of Lugalvan BNO12 in the plating bath of Example 2.4 leads to a smooth surface in combination with a uniform plating height in contrast to Comparative Examples 2.1 and 2.2.

Example 2.5

A tin plating bath as described for Comparative Example 2.1 containing 1 g/l Surfactant 5 instead of Lugalvan BNO12 was prepared. The plating procedure was the one described in Comparative Example 2.1. The plated tin bump was examined with a laser scanning microscope (LSM) and scanning electron microscopy (SEM). A mean roughness (Ra) of 0.17 μm and a coplanarity (COP) of 0% was determined.

Figure 5:
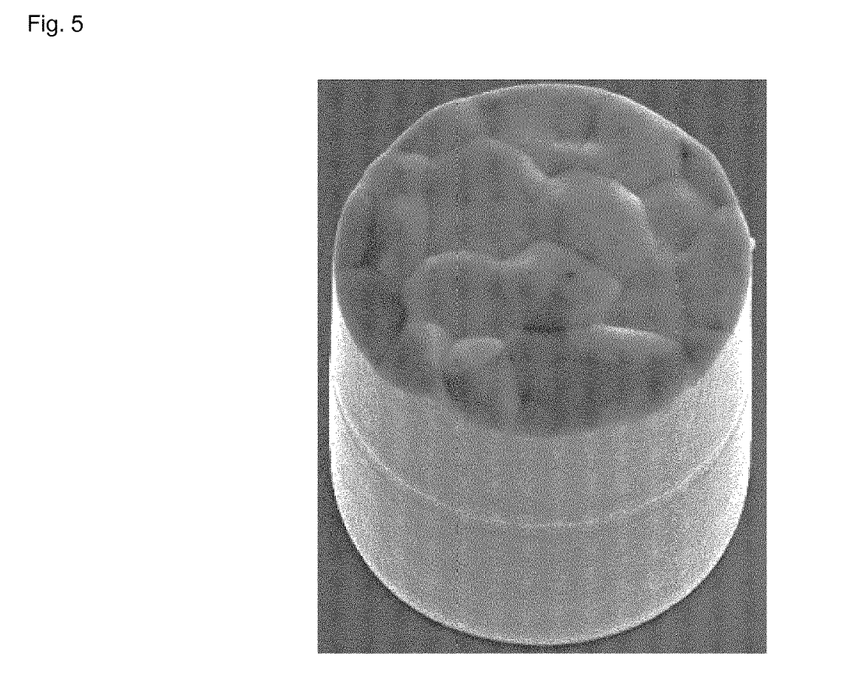
FIG. 5 shows a SEM image of a tin bump electroplated according to Example 2.5.

The results are summarized in Table 1 and depicted in FIG. 5.

Using Surfactant 5 instead of Lugalvan BNO12 in the plating bath of Example 2.5 leads to a smooth surface in combination with a uniform plating height in contrast to Comparative Examples 2.1 and 2.2.

Example 2.6

A tin plating bath as described for Comparative Example 2.1 containing 1 g/l Surfactant 6 instead of Lugalvan BNO12 was prepared. The plating procedure was the one described in Comparative Example 2.1. The plated tin bump was examined with a laser scanning microscope (LSM) and scanning electron microscopy (SEM). A mean roughness (Ra) of 0.17 μm and a coplanarity (COP) of 1% was determined.

Figure 6:
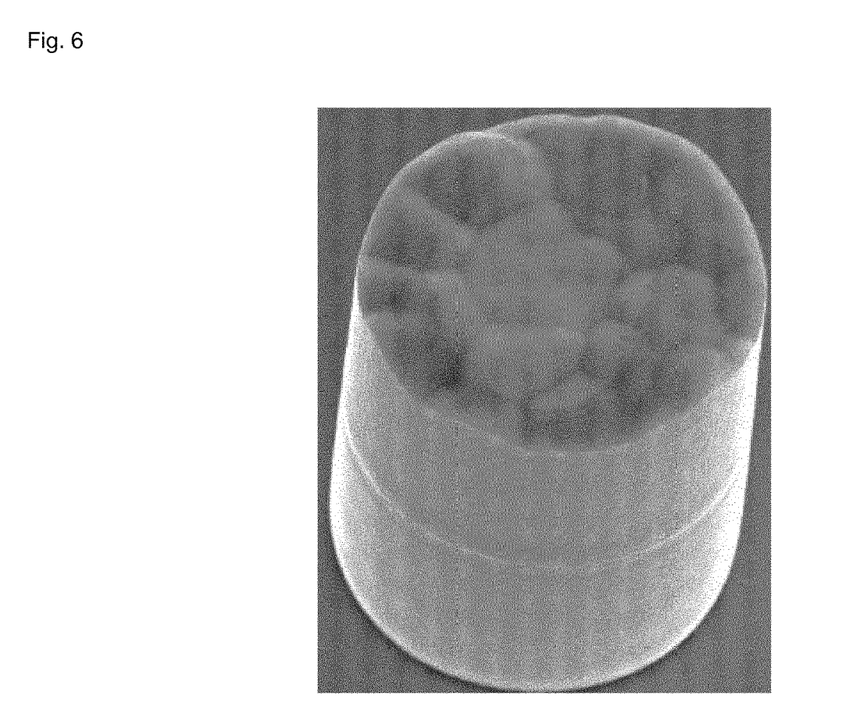
FIG. 6 shows a SEM image of a tin bump electroplated according to Example 2.6.

The results are summarized in Table 1 and depicted in FIG. 6.

Using Surfactant 6 instead of Lugalvan BNO12 in the plating bath of Example 2.6 leads to a smooth surface in combination with a uniform plating height in contrast to Comparative Examples 2.1 and 2.2.

TABLE 1

| Example | Suppressor | Grain Refiner | Ra [μm] | COP [%] |
| --- | --- | --- | --- | --- |
| Comp. 2.1 | Lugalvan BNO 12 | — | 0.4 | 4 |
| Comp. 2.2 | Lugalvan BNO 12 | benzylidene acetone | 0.12 | −11 |
| 2.3 | Surfactant 3 | — | 0.14 | 2 |
| 2.4 | Surfactant 4 | — | 0.16 | 1 |
| 2.5 | Surfactant 5 | — | 0.17 | 0 |
| 2.6 | Surfactant 6 | — | 0.17 | 1 |

Example 2.7

A tin silver plating bath with the following composition was prepared: 75 g/l tin as tin methanesulfonate, 165 g/l methanesulfonic acid, 0.5 g/l silver as silver methanesulfonate, 5.1 g/l of 1,4-Bis[2-(2-pyridyl)ethylsulfanyl]butane-2,3-diol as Ag complexing agent, 2 g/l of a commercial anti-oxidant and 2 g/l of surfactant 7.37 μm of a tin silver alloy (SnAg) with a silver content of 1.5% by weight was electroplated on a copper bump. The copper bump had a diameter of 50 μm and a height of 5 μm. A 2 cm×2 cm large wafer coupon with a 70 μm thick patterned photo resist layer was immersed in the above described plating bath and a direct current of 5.4 ASD has been applied for 814 s at 25° C.

The plated tin silver bump was examined with a laser scanning microscope (LSM) and scanning electron microscopy (SEM). A mean roughness (Ra) of 1.66 μm and a coplanarity (COP) of 2.2% has been determined.

Figure 7:
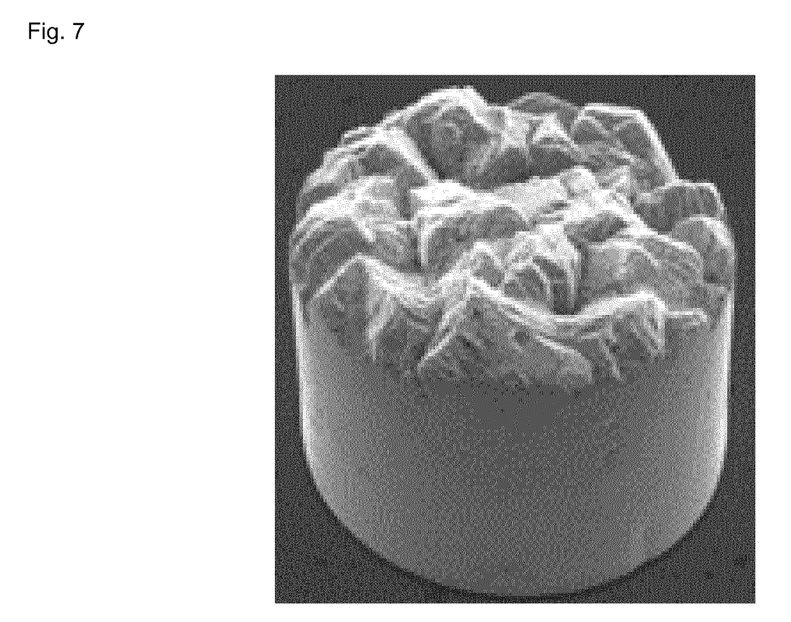
FIG. 7 shows a SEM image of a tin bump electroplated according to Example 2.7.

The results are summarized in Table 2 and depicted in FIG. 7.

The roughness and coplanarity of the SnAg bumps in this example are much better compared to electroplating compositions without or with other state of the art additives. It is important to note that roughness and coplanarity of this example cannot be directly compared with examples 2.1 to 2.6 since the bump material, bump geometry and deposition conditions are different. The most important difference is the height of the deposited bump, which increases by a factor of more than 10 from 3.5 μm in examples 2.1 to 2.6 to 37 μm in this example. Generally, Sn and SnAg deposits roughness increases with increasing height which makes plating of bigger bumps much more challenging.

The roughness and coplanarity of the SnAg bumps in this example are much better compared to electroplating compositions with other state of the art additives.

Example 2.8

A tin silver plating bath with the following composition was prepared: 75 g/l tin as tin methanesulfonate, 165 g/l methanesulfonic acid, 0.5 g/l silver as silver methanesulfonate, 5.1 g/l of 1,4-Bis[2-(2-pyridyl)ethylsulfanyl]butane-2,3-diol as Ag complexing agent, 2 g/l of a commercial anti-oxidant and 2 g/l of surfactant 8.37 μm of a tin silver alloy (SnAg) with a silver content of 1.5% by weight was electroplated on a copper bump. The copper bump had a diameter of 50 μm and a height of 5 μm. A 2 cm×2 cm large wafer coupon with a 70 μm thick patterned photo resist layer has been immersed in the above described plating bath and a direct current of 5.4 ASD was applied for 814 s at 25° C.

The plated tin silver bump was examined with a laser scanning microscope (LSM) and scanning electron microscopy (SEM). A mean roughness (Ra) of 1.86 μm and a coplanarity (COP) of 1.8% was determined.

Figure 8:
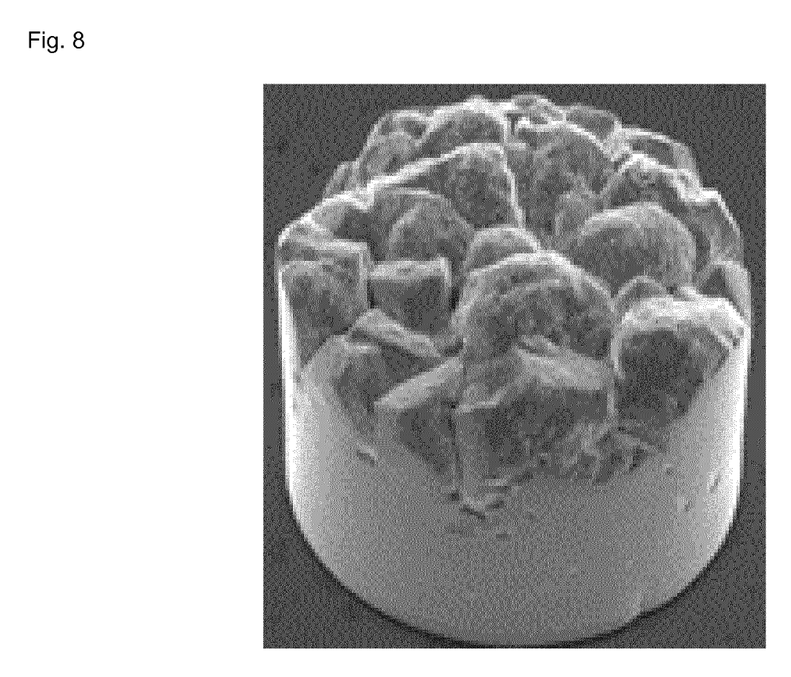
FIG. 8 shows a SEM image of a tin bump electroplated according to Example 2.8.

The results are summarized in Table 2 and depicted in FIG. 8.

The roughness and coplanarity of the SnAg bumps in this example are much better compared to electroplating compositions with other state of the art additives

TABLE 2

| Example | Suppressor | Grain Refiner | Ra [μm] | COP [%] |
| --- | --- | --- | --- | --- |
| 2.7 | Surfactant 7 | — | 1.66 | 2.2 |
| 2.8 | Surfactant 8 | — | 1.86 | 1.8 |

The invention claimed is:
1. An aqueous composition comprising tin ions and at least one compound of formula I wherein:

$X^1$ is $-(CHR^{42})_u-Y-(CHR^{42})_v-$;

$R^{11}$ is a copolymer of ethylene oxide and a further $C_3$ to $C_6$ alkylene oxide, having a content of ethylene oxide is from 5 to 30% by weight relative to the copolymer weight;

$R^{12}$ is at least one selected from the group consisting of H, $R^{11}$, and $R^{40}$;

$R^{13}$, $R^{14}$ are each independently selected from the group consisting of H, $R^{11}$, and $R^{40}$;

$R^{40}$ is at least one selected from the group consisting of H, a linear $C_1$-$C_{20}$ alkyl, and a branched $C_1$-$C_{20}$ alkyl;

Y is a divalent aromatic moiety;

u, v are integers each independently selected from 1 to 6; and $R^{42}$ is a $C_1$ to $C_4$ alkanediyl.

2. The aqueous composition according to claim 1, wherein Y is a divalent mono or bicyclic $C_5$ to $C_{12}$ aromatic moiety.

3. The aqueous composition according to claim 1, wherein $R^{12}$, $R^{13}$, and $R^{14}$ are each independently selected from $R^{11}$.

4. The aqueous composition according to claim 1, wherein the further $C_3$ to $C_6$ alkylene oxide is propylene oxide.

5. The aqueous composition according to claim 1, wherein the content of ethylene oxide in the copolymer of ethylene oxide and the further $C_3$ to $C_6$ alkylene oxide is from 10 to 25% by weight relative to the weight of the copolymer.

6. The aqueous composition according to claim 1, further comprising a single grain refiner that is not an α,β-unsaturated aliphatic carbonyl compound.

7. The aqueous composition according to claim 1, which comprises essentially no grain refiner.

8. The aqueous composition according to claim 1, wherein Y is at least one selected from the group consisting of ortho phenylene, meta phenylene, para phenylene, and toluylene.

9. The aqueous composition according to claim 1, wherein $R^{42}$ is at least one selected from the group consisting of methanediyl and ethanediyl.

10. The aqueous composition according to claim 1, wherein $X^1$ is xylylene.

11. The aqueous composition according to claim 1, which further comprises silver ions.

12. A method for depositing tin or tin alloys on a substrate comprising features having an aperture size from 500 nm to 500 μm, the method comprising:

contacting the substrate with the composition of claim 1.

13. A process for electrodepositing a tin or a tin alloy onto a substrate, comprising:

contacting the composition of claim 1 with the substrate, and applying a current to the substrate after the contacting for a time sufficient to deposit a tin or tin alloy layer onto the substrate, wherein the substrate comprises features having an aperture size from 500 nm to 500 μm, and the deposition is performed to fill these features.

14. The process according to claim 13, wherein the aperture size is from 1 μm to 200 μm.

* * * * *